(12) United States Patent
Ramaraju et al.

(10) Patent No.: US 7,365,587 B2
(45) Date of Patent: Apr. 29, 2008

(54) CONTENTION-FREE KEEPER CIRCUIT AND A METHOD FOR CONTENTION ELIMINATION

(75) Inventors: Ravindraraj Ramaraju, Round Rock, TX (US); Prashant U. Kenkare, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 159 days.

(21) Appl. No.: 11/279,018

(22) Filed: Apr. 7, 2006

(65) Prior Publication Data

US 2007/0236263 A1    Oct. 11, 2007

(51) Int. Cl.
*H03L 5/00* (2006.01)
(52) U.S. Cl. ............................. 327/331; 327/112
(58) Field of Classification Search ............. None
See application file for complete search history.

(56) References Cited

U.S. PATENT DOCUMENTS

| | | | |
|---|---|---|---|
| 5,532,630 A | | 7/1996 | Waggoner et al. |
| 6,195,301 B1 | | 2/2001 | Huffman et al. |
| 6,198,323 B1 | * | 3/2001 | Offord .................. 327/202 |
| 6,351,151 B2 | * | 2/2002 | Kumar et al. ............ 326/98 |
| 6,484,267 B1 | * | 11/2002 | Lee et al. ................ 713/600 |
| 6,545,512 B2 | * | 4/2003 | Nowka ..................... 327/108 |
| 6,653,873 B1 | * | 11/2003 | Nguyen ................... 327/112 |
| 6,707,318 B2 | * | 3/2004 | Kumar et al. ............ 326/98 |
| 7,053,663 B2 | * | 5/2006 | Hazucha et al. ......... 326/121 |
| 7,218,151 B1 | * | 5/2007 | Kursun et al. ............ 326/95 |
| 7,242,629 B2 | * | 7/2007 | Luk et al. ................. 365/205 |
| 2005/0007153 A1 | * | 1/2005 | Ding et al. ............... 326/98 |

\* cited by examiner

*Primary Examiner*—Cassandra Cox
(74) *Attorney, Agent, or Firm*—Ranjeev Singh; Michael J. Balconi-Lamica

(57) ABSTRACT

A contention-free keeper circuit including a keeper circuit having a first node and a second node, is provided. The contention-free keeper circuit may further include a delay element for providing time delay. The contention-free keeper circuit may further include a high-to-low contention element coupled between the first node and a first supply, and coupled to the delay element output. The contention-free keeper circuit may further include a low-to-high contention elimination element coupled between the first node and a second supply, and coupled to the delay element output, (i) wherein responsive to a low-to-high transition at the first node and the time delay, the low-to-high contention elimination element eliminates a low-to-high contention within the keeper circuit, and (ii) wherein responsive to a high-to-low signal transition at the first node and the time delay, the high-to-low contention elimination element eliminates a high-to-low contention within the keeper circuit.

20 Claims, 4 Drawing Sheets

CONTENTION-FREE KEEPER CIRCUIT AND A METHOD FOR CONTENTION ELIMINATION

BACKGROUND OF THE INVENTION

1. Field of the Invention

This invention relates in general to circuits and more specifically to a contention-free keeper circuit and a method for contention elimination.

2. Description of the Related Art

Signal degradation on transmission lines, such as buses, word lines, or other control and/or data transmission lines is a significant problem. In particular, in a long transmission line the signal driven from one end of the line to the other end of the line degrades by the time it reaches the other end of the line. The signal degradation relates to degradation in the edge rate of the signal as well as degradation in the ability of the signal to reach a certain level. The edge rate of the signal may decrease as the signal propagates along a long transmission line. Similarly, the signal may not attain a certain level by the time it reaches the other end of the long transmission line.

Traditional approaches to solve this problem include the use of signal repeaters along the long transmission line. The use of signal repeaters along the line, however, introduces a delay in the signal being driven from one end of the line to the other end of the line. Other approaches to solve this problem have focused on the use of a keeper circuit attached to the other end of the transmission line. By way of example, FIG. 1 shows a conventional full-keeper circuit 10, which is attached to the other end of the transmission line. Conventional full-keeper circuit 10 includes a first node 12 and a second node 14 with an inverter 16 connected between first node 12 and second node 14. Full-keeper circuit 10 further includes a p-MOS transistor (P1) 18 with its control terminal coupled to second node 14. Full-keeper circuit 10 further includes an n-MOS transistor (N1) 20 with its control terminal coupled to second node 14. When a signal is transitioning from low to high at first node 12, at the point when the signal is low at first node 12, the signal is high at second node 14. As the signal at first node 12 goes beyond a certain level, the signal at second node 14 turns low, which turns on transistor (P1) 18 and thereby pulling up the rising signal at first node 12. On the other hand when the signal is transitioning from high to low at first node 12, at the point when the signal is high at first node 12, the signal is low at second node 14. As the signal at first node 12 goes below a certain threshold, the signal at second node turns high, which turns on transistor (N1) 20 and thereby pulling down the falling signal at first node 12. The presence of transistors (P1) 18 and (N1) 20, however, creates contention. In particular, as the signal at first node 12 goes from low to high, transistor (N1) 20 stays turned on until signal at second node 14 goes below the threshold voltage of transistor (N1) 20. During the time that transistor (N1) 20 stays on, it pulls down the signal at first node 12 even though the signal is rising. This creates a contention between the rising signal at first node 12 and transistor (N1) 20. Similarly, as the signal at first node 12 goes from high to low, transistor (P1) 18 stays turned on until the signal at second node 14 goes above the threshold voltage of transistor (P1) 18. During the time transistor (P1) 18 stays on, it pulls up the signal at first node even though the signal is falling. This creates a contention between the falling signal at first node 12 and transistor (P1) 18. This contention in turn creates a short circuit current path. That in turn increases the transition time between levels. Also, the short circuit current path results in increased current consumption.

Thus, there is a need for a contention-free keeper circuit and a method for contention elimination.

BRIEF DESCRIPTION OF THE DRAWINGS

The present invention may be better understood, and its numerous objects, features, and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The following sets forth a detailed description of a mode for carrying out the invention. The description is intended to be illustrative of the invention and should not be taken to be limiting.

In one aspect, a contention-free keeper circuit may include a keeper circuit, wherein the keeper circuit includes a first node and a second node. The contention-free keeper circuit may further include a delay element for providing time delay, the delay element having an input and an output, wherein the delay element input is coupled to one selected from a group consisting of first node and the second node. The contention-free keeper circuit may further include a high-to-low contention elimination element coupled between the first node and a first supply, and coupled to the delay element. The contention-free keeper circuit may further include a low-to-high contention elimination element coupled between a second supply and the first node, and coupled to the delay element output, (i) wherein responsive to a low-to-high transition at the first node and the time delay, the low-to-high contention elimination element eliminates a low-to-high contention within the keeper circuit, and (ii) wherein responsive to a high-to-low signal transition at the first node and the time delay, the high-to-low contention elimination element eliminates a high-to-low contention within the keeper circuit, further wherein the first supply is greater than the second supply.

In another aspect, a contention-free keeper circuit may include a keeper circuit, wherein the keeper circuit includes a first node and a second node. The contention-free keeper circuit may further include a delay element for providing time delay, the delay element having an input and an output, wherein the delay element input is coupled to one selected from a group consisting of first node and the second node. The contention-free keeper circuit may further include a contention elimination element coupled between a supply and the first node, and coupled to the delay element output, wherein responsive to a transition at the first node from a first level to another level and the time delay, the contention elimination element eliminates a contention within the keeper circuit.

Figure 1:
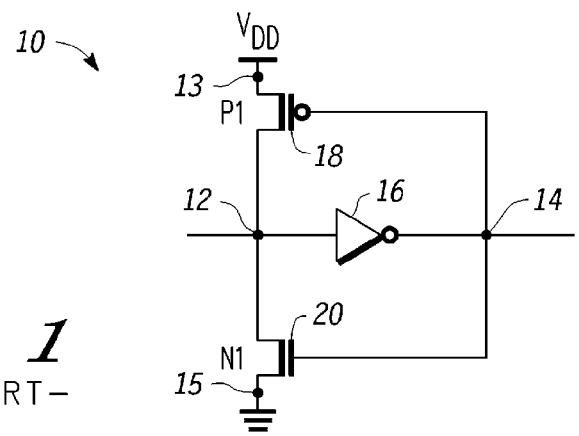
FIG. 1 shows a conventional full-keeper circuit.
Figure 2:
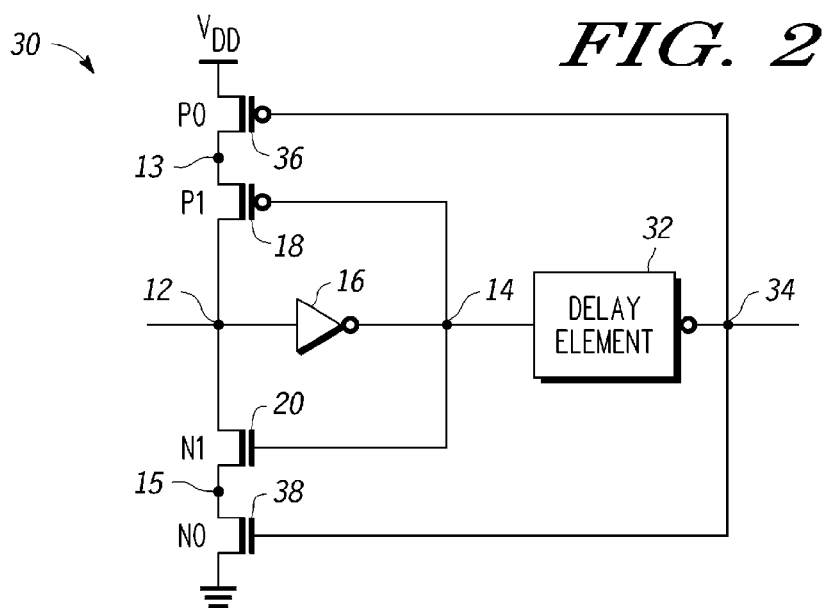
FIG. 2 shows a diagram of an exemplary contention-free keeper circuit, consistent with one embodiment of the invention.

FIG. 2 shows a diagram of an exemplary contention-free keeper circuit 30, consistent with one embodiment of the invention. Contention-free keeper circuit 30 may include a first node 12 and a second node 14 with an inverter 16 connected between first node 12 and second node 14. Contention-free keeper circuit 30 may further include a first p-MOS transistor (P1) 18 with its control terminal coupled to second node 14. Contention-free keeper circuit 30 may further include a first n-MOS transistor (N1) 20 with its control terminal coupled to second node 14. When a signal is transitioning from low to high at first node 12, at the point when the signal is low at first node 12, the signal is high at second node 14. As the signal at first node 12 goes beyond a certain level, the signal at second node 14 turns low, which turns on first transistor (P1) 18 and thereby further pulling up the rising signal at first node 12. On the other hand when the signal is transitioning from high to low at first node 12, at the point when the signal is high at first node 12, the signal is low at second node 14. As the signal at first node 12 goes below a certain threshold, the signal at second node turns high, which turns on first transistor (N1) 20 and thereby further pulling down the falling signal at first node 12.

Contention-free keeper circuit 30 may further include a second p-MOS transistor (P0) 36 coupled in series with first p-MOS transistor (P1) 18 with its control terminal coupled to a third node 34. One current terminal of second p-MOS transistor (P0) 36 may be coupled to a supply node 13 of full-keeper circuit 10 and the other current terminal of second p-MOS transistor (P0) 36 may be coupled to a voltage supply, such as $V_{dd}$. Second p-MOS transistor (P0) 36 may act as a first contention elimination element, as explained below. An inverting delay element 32 may be coupled between second node 14 and third node 34. Contention-free keeper circuit 30 may further include a second n-MOS transistor (N0) 38 with its control terminal coupled to third node 34. One current terminal of second n-MOS transistor (N0) 38 may be coupled to a supply node 15 of full-keeper circuit 10 and the other current terminal of second n-MOS transistor (N0) 38 may be coupled to a voltage supply, such as $V_{dd}$. Second n-MOS transistor (N0) 38 may act as a second contention elimination element, as explained below. In particular, second p-MOS transistor (P0) 36, second n-MOS transistor (N0) 38, and delay element 32 may remove contention between a driven signal at first node 12 and first p-MOS transistor (P1) 18 and first n-MOS transistor (N1) 20. When a signal is transitioning from low to high at first node 12, at the point when the signal is low at first node 12, the signal is high at second node 14 and the signal is low at third node 34. Therefore, second p-MOS transistor (P0) 36 is on and second n-MOS transistor (N0) 38 is off. At the same time, however, first p-MOS transistor (P1) 18 is off and first n-MOS transistor (N1) 20 is on. As the signal at first node 12 goes beyond a certain level, the signal at second node 14 turns low thereby turning on first p-MOS transistor (P1) 18 and turning off first n-MOS transistor (N1) 20. As a result there is a short period of time when both first p-MOS transistor (P1) 18 and first n-MOS transistor (N1) 20 are conducting. However, there is no contention because second n-MOS transistor (N0) is off and hence there is no path to ground. Similarly, when a signal is transitioning from high to low at first node 12, at the point when the signal is high at first node 12, the signal is low at second node 14 and the signal is high at third node 34. Therefore, second n-MOS transistor (N0) 38 is on and second p-MOS transistor (P0) is off. At the same time, however, first n-MOS transistor (N1) 20 is off and first p-MOS transistor 18 is on. As the signal at first node 12 goes below a certain level, the signal at second node 14 turns high thereby turning on first n-MOS transistor (N0) 20 and turning off first p-MOS transistor (P1) 18. Thus, the possibility of contention between first p-MOS transistor (P1) 18 and first n-MOS transistor (N1) 20 is eliminated because second p-MOS transistor (P0) is off and hence there is no path to a supply voltage, such as $V_{dd}$ shown in FIG. 2. Inverting delay element 32 is implemented such that it introduces a time delay that at least exceeds or is at least equal to the transition time of the signal from a low to high and/or vice-versa at first node 12. Alternatively, the time delay may be selected such that it is longer of the transition time of the signal from low to high and the transition time of the signal from high to low.

Figure 3:
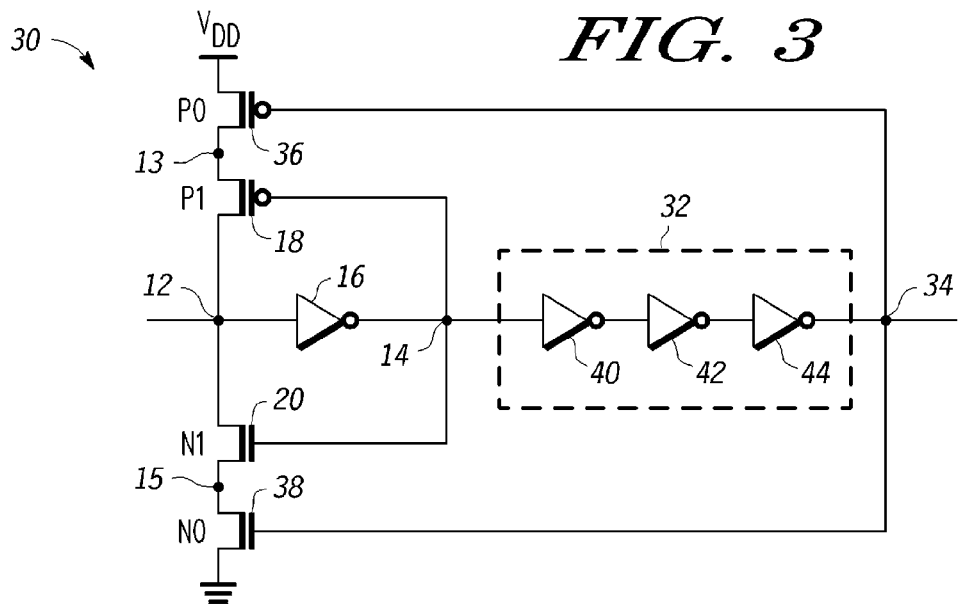
FIG. 3 shows a diagram of an exemplary implementation of the exemplary contention-free keeper circuit of FIG. 2, consistent with one embodiment of the invention.

As shown in FIG. 3, inverting delay element 32 may be implemented using three inverters 40, 42, and 44 coupled in a series. Although FIG. 3 shows three inverters, more or fewer odd-number of inverters may be used to implement inverting delay element 32.

Figure 4:
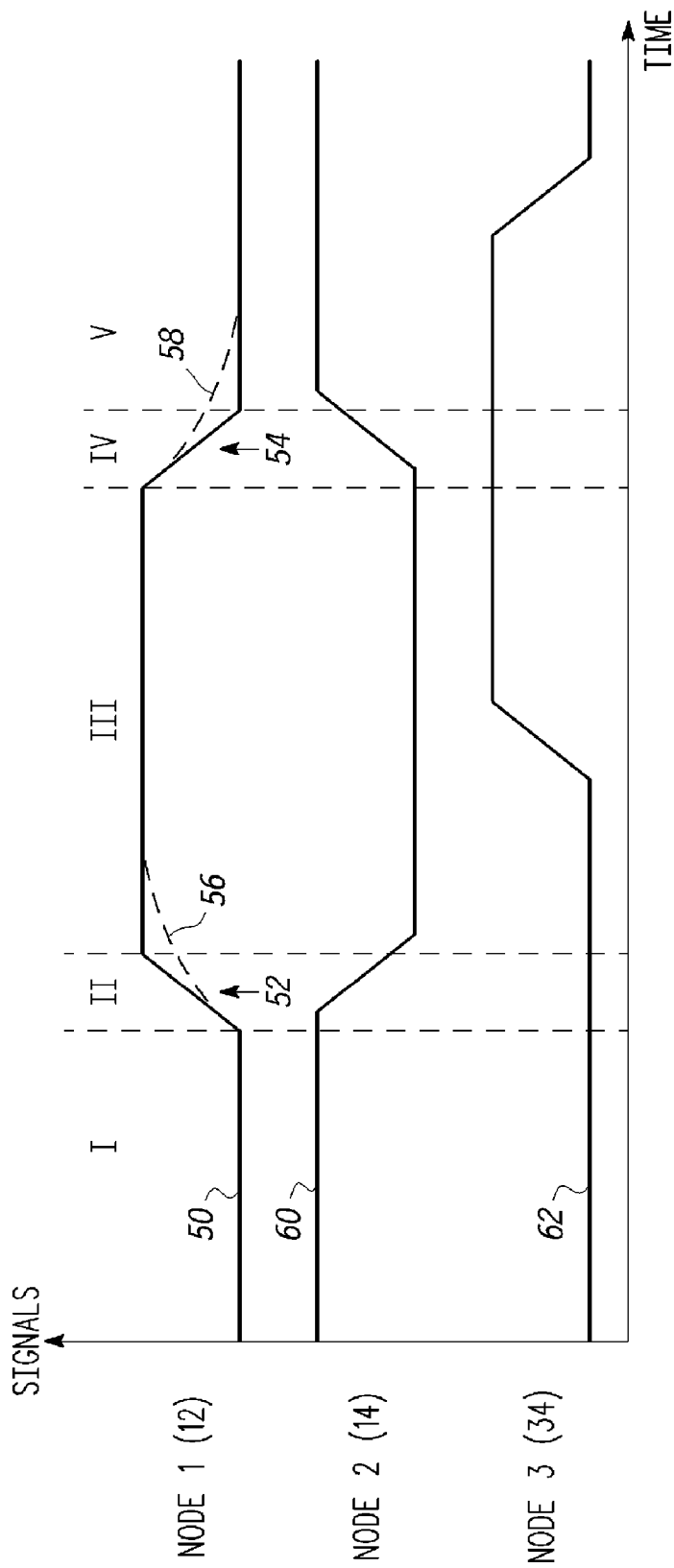
FIG. 4 shows an exemplary timing diagram for signals at various nodes of the exemplary contention-free keeper circuit of FIG. 2, consistent with one embodiment of the invention.

Referring now to FIG. 4, a timing diagram (showing signals versus time) of contention-free keeper circuit 30 is described. In particular, FIG. 4 shows a timing diagram for a signal 50 at first node 12 (labeled as N0DE 1 (12) in FIG. 4), a timing diagram for a signal 60 at second node 14 (labeled as N0DE 2 (14) in FIG. 4), and a timing diagram for a signal 62 at third node 34 (labeled as N0DE 3 (34) in FIG. 4). As shown in FIG. 4, in portion I, when signal 50 at first node 12 is high, signal 60 at second node 14 is low and signal 62 at third node 34 is low. As signal 50 in portion II transitions from low to high (labeled as 52) signal 60 in portion II goes from high to low. Dashed line 56 shows how signal 50 would change if contention-free keeper circuit 30 of FIG. 2 did not have contention elimination elements (second p-MOS transistor (P0) 36 and second n-MOS transistor (N0) 38). Signal 62 at third node 34 transitions from low to high after a delay determined by inverting delay element 32. As explained above, inverting delay element 32 is implemented such that the delay is at least equal to or exceeds the transition time of signal 50 at first node 12. In portion III, signal 50 stays high and signal 62 also stays high, after transitioning to the high level. In portion IV, as signal 50 transitions from high to low (labeled as 54), signal 60 in portion IV goes from low to high. Dashed line 58 shows how signal 50 would change if contention-free keeper circuit 30 of FIG. 2 did not have contention elimination elements (second-MOS transistor (P0) 36 and second n-MOS transistor (N0) 38). Signal 62 at third node 34 transitions from high to low.

Figure 5:
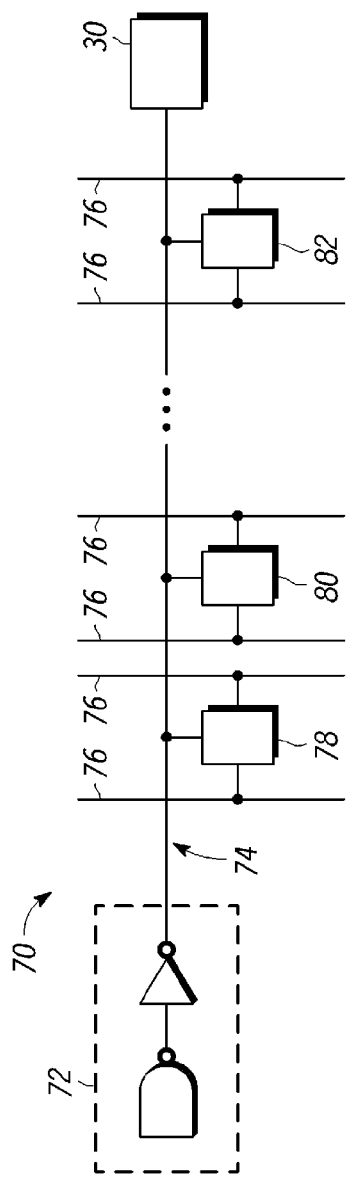
FIG. 5 shows an exemplary word line using the exemplary contention-free keeper circuit of FIG. 2, consistent with one embodiment of the invention.

FIG. 5 shows an exemplary row 70 using the exemplary contention-free keeper circuit of FIG. 2, consistent with one embodiment of the invention. Exemplary row 70 may be part of a memory array (not shown). Row 70 may include a driving element 72, which may include a NAND gate coupled to an inverter, coupled to one end of word line 74. Row 70 may include a series of bit cells 78, 80, and 82, each of which may be coupled to bit lines 76. A contention-free keeper circuit 30 may be coupled to the other end of word line 74. Contention-free keeper circuit 30 thus may reduce the signal degradation toward the end of word line 74. Although not shown in FIG. 5, a contention-free keeper circuit may be inserted in series with or in parallel to word line 74.

Figure 6:
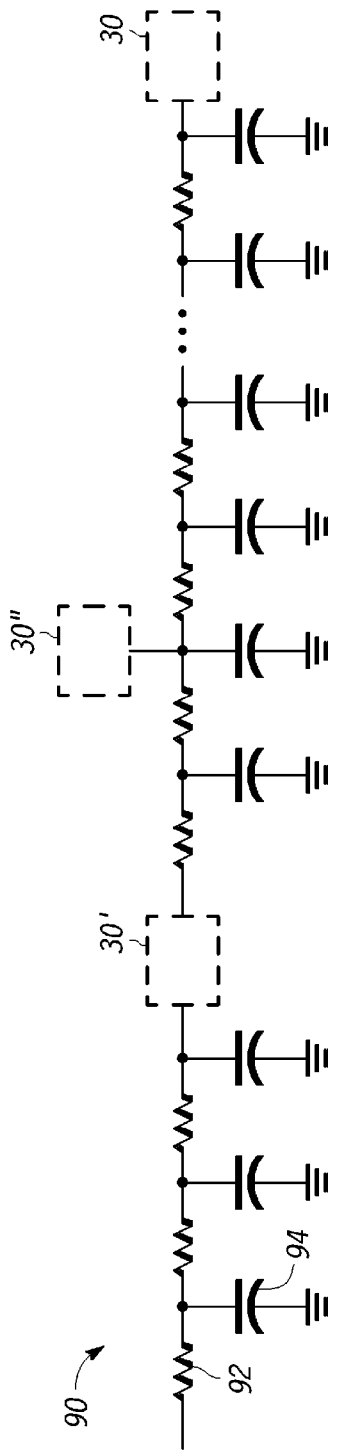
FIG. 6 shows a transmission line with exemplary contention-free keeper circuits, consistent with one embodiment of the invention.

FIG. 6 shows a transmission line 90 with exemplary contention-free keeper circuits, consistent with one embodiment of the invention. Transmission line 90 may be a bus, part of a bus, or any other signal carrying line. Transmission line 90 may have several elements coupled between its two ends. A signal driving its first end may degrade by the time it reaches the other end because of the resistive 92 and capacitive 94 effects of the elements and the line itself. As shown in FIG. 6, contention-free keeper circuit 30 may be coupled to an end of transmission line 90. Alternatively and/or additionally, a contention-free keeper circuit 30' may be inserted in series with transmission line 90. Alternatively and/or additionally, a contention-free keeper circuit 30" may be coupled in parallel to transmission line 90.

Figure 7:
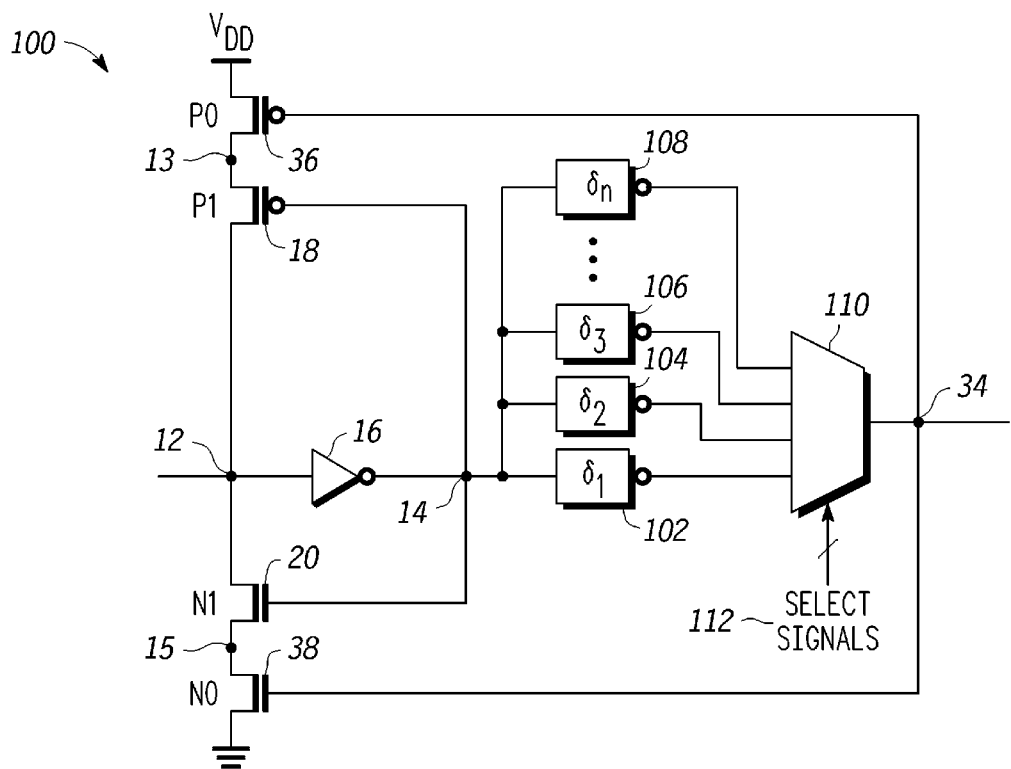
FIG. 7 shows a diagram of another exemplary contention-free keeper circuit, consistent with one embodiment of the invention.

FIG. 7 shows a diagram of another exemplary contention-free keeper circuit 100, consistent with one embodiment of the invention. Contention-free keeper circuit 100 may include elements similar to contention-free keeper circuit 30. However, instead of a single delay element it may include several delay elements 102, 104, 106, and 108, for example, any of which may be coupled between second node 14 and third node 34 by multiplexer 110 based on select signals 112. Delay elements 102, 104, 106, and 108 may be inverting and may each provide a different amount of delay. Although FIG. 7 shows select signals 112 for controlling multiplexer 110, multiplexer 110 may be controlled using other means, as well. Also, other mechanisms may be used to select an appropriate delay for a signal being driven on a transmission line or word line where contention-free keeper circuit 30 is being used. Although FIG. 7 shows delay elements coupled between second node 14 and third node 34, delay elements may be coupled between first node 12 and third node 34 when they are non-inverting.

Figure 8:
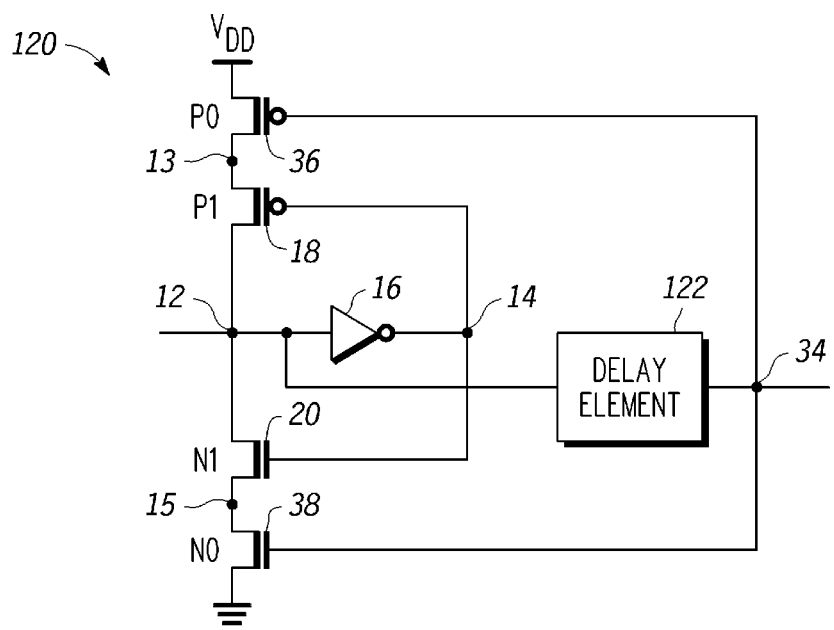
FIG. 8 shows a diagram of yet another exemplary contention-free keeper circuit, consistent with one embodiment of the invention.

FIG. 8 shows a diagram of yet another exemplary contention-free keeper circuit 120, consistent with one embodiment of the invention. Contention-free keeper circuit 120 may include similar elements, as shown in FIG. 2 for contention-free keeper circuit 30. However, unlike contention-free keeper circuit 30, it may have a non-inverting delay element 122 coupled between first node 12 and third node 34. In operation, contention-free keeper circuit 120 may provide similar functionality as contention-free keeper circuit 30. In particular, second p-MOS transistor (P0) 36, second n-MOS transistor (N0) 38, and delay element 122 may remove contention between a driven signal at first node 12 and first p-MOS transistor (P1) 18 and first n-MOS transistor (N1) 20. When a signal is transitioning from low to high at first node 12, at the point when the signal is low at first node 12, the signal is high at second node 14 and the signal is low at third node 34. Therefore, second p-MOS transistor (P0) 36 is on and second n-MOS transistor (N0) 38 is off. At the same time, however, first p-MOS transistor (P1) 18 is off and first n-MOS transistor (N1) 20 is on. As the signal at first node 12 goes beyond a certain level, the signal at second node 14 turns low thereby turning on first p-MOS transistor (P1) 18 and turning off first n-MOS transistor (N1) 20. However, this does not result in a contention between the rising signal at first node 12 and first n-MOS transistor (N1) 20 because second n-MOS transistor (N0) is off and hence there is no path to ground. Similarly, when a signal is transitioning from high to low at first node 12, at the point when the signal is high at first node 12, the signal is low at second node 14 and the signal is high at third node 34. Therefore, second n-MOS transistor (N0) 38 is on and second p-MOS transistor (P0) is off. At the same time, however, first n-MOS transistor (N1) 20 is off and first p-MOS transistor 18 is on. As the signal at first node 12 goes below a certain level, the signal at second node 14 turns high thereby turning on first n-MOS transistor (N0) 20 and turning off first p-MOS transistor (P1) 18. However, this does not result in a contention between the falling signal at first node 12 and first p-MOS transistor (P1) 18 because second p-MOS transistor (P0) 36 is off and hence there is no path to a supply voltage, such as $V_{dd}$ shown in FIG. 2. Non-inverting delay element 122 is implemented such that it introduces a time delay that at least exceeds or is at least equal to the transition time of the signal from a low to high and vice-versa at first node 12. Non-inverting delay element 122 may be implemented using an even number of inverters coupled in a series, for example.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A contention-free keeper circuit, comprising:
   a keeper circuit, wherein the keeper circuit includes a first node and a second node;
   a delay element for providing a time delay, the delay element having an input and an output, wherein the delay element input is coupled to one selected from the group consisting of the first node and the second node;
   a high-to-low contention elimination element coupled between the first node and a first supply, and coupled to the delay element output; and
   a low-to-high contention elimination element coupled between the first node and a second supply, and coupled to the delay element output, (i) wherein responsive to a low-to-high transition at the first node and the time delay, the low-to-high contention elimination element eliminates a low-to-high contention within the keeper circuit, and (ii) wherein responsive to a high-to-low signal transition at the first node and the time delay, the high-to-low contention elimination element eliminates a high-to-low contention within the keeper circuit, further wherein the first supply is greater than the second supply.

2. The circuit of claim 1, wherein the time delay is at least equal to or greater than a time duration of one selected from the low-to-high signal transition and the high-to-low signal transition.

3. The circuit of claim 2, further wherein the time duration comprises a longer of (i) the low-to-high signal transition duration or (ii) the high-to-low signal transition duration.

4. The circuit of claim 1, wherein the delay element comprises an inverting delay element and wherein the delay element input is coupled to the second node.

5. The circuit of claim 1, wherein the delay element comprises a non-inverting delay element and wherein the delay element is coupled to the first node.

6. The circuit of claim 1, wherein the delay element comprises an odd number of serially coupled inverting elements.

7. The circuit of claim 1, wherein the delay element comprises a plurality of delay elements and a multiplexer, the plurality of delay elements having one or more different time delay durations, the multiplexer having a plurality of inputs and an output, each delay element of the plurality being coupled between (i) one of the first node or second node and (ii) a corresponding input of the multiplexer, and the output of the multiplexer being coupled to a third node, wherein responsive to a select input, the multiplexer couples a corresponding delay element of the plurality to the third node.

8. The circuit of claim 7, wherein the plurality of delay elements comprise inverting delay elements.

9. The circuit of claim 1, wherein the high-to-low contention elimination element comprises a first type transistor, and wherein the low-to-high contention elimination element comprises a second type transistor different from the first type transistor.

10. The circuit of claim 9, further wherein the first type transistor includes a PMOS transistor, and wherein the second type transistor includes an NMOS transistor.

11. The circuit of claim 1, wherein the keeper circuit includes an inverter coupled between the first node and the second node.

12. The circuit of claim 1, wherein the low-to-high transition element includes a transistor of a first type and wherein the high-to-low transition element includes a transistor of a second type, the second type being different from the first type.

13. In a signal line having inherent resistance and inherent capacitance, the signal line includes a contention-free keeper circuit according to claim 1, wherein the contention-free keeper circuit is coupled to the signal line in one selected from the group consisting of a parallel configuration, a serial configuration, and a termination configuration.

14. In a memory array having a plurality of bit cells, the memory array including a contention-free keeper circuit according to claim 1, wherein the contention-free keeper circuit is coupled to a word line of the memory array of bit cells in one selected from the group consisting of a parallel configuration, a serial configuration, and a termination configuration.

15. A contention-free keeper circuit, comprising:
a keeper circuit, wherein the keeper circuit includes a first node and a second node;
a delay element for providing a time delay, the delay element having an input and an output, wherein the delay element input is coupled to one selected from the group consisting of the first node and the second node; and
a contention elimination element coupled between a supply and the first node, and coupled to the delay element output, wherein responsive to a transition at the first node from a first level to another level and the time delay, the contention elimination element eliminates a contention within the keeper circuit.

16. The contention-free keeper circuit of claim 15, wherein the transition is a low-to-high signal transition or a high-to-low signal transition.

17. The contention-free keeper circuit of claim 16, wherein the time delay is at least equal to or greater than a time duration of one selected from the low-to-high signal transition and the high-to-low signal transition.

18. The contention-free keeper circuit of claim 15 wherein the delay element comprises an odd number of serially coupled inverting elements.

19. The contention-free keeper circuit of claim 15, wherein the delay element comprises an inverting delay element and wherein the delay element input is coupled to the second node.

20. The contention-free keeper circuit of claim 15, wherein the delay element comprises a plurality of delay elements and a multiplexer, the plurality of delay elements having one or more different time delay durations, the multiplexer having a plurality of inputs and an output, each delay element of the plurality being coupled between (i) one of the first node or second node and (ii) a corresponding input of the multiplexer, and the output of the multiplexer being coupled to a third node, wherein responsive to a select input, the multiplexer couples a corresponding delay element of the plurality to the third node.

* * * * *